(12) United States Patent
Yoshizawa et al.

(10) Patent No.: US 7,579,072 B2
(45) Date of Patent: Aug. 25, 2009

(54) SUBSTRATE ACCOMMODATING TRAY

(75) Inventors: Takenori Yoshizawa, Tsu (JP); Hiroto Shibata, Sendai (JP)

(73) Assignees: Sharp Kabushiki Kaisha, Osaka (JP); Sydex Corporation, Mivagi (JP)

( * ) Notice: Subject to any disclaimer, the term of this patent is extended or adjusted under 35 U.S.C. 154(b) by 0 days.

(21) Appl. No.: 11/012,200

(22) Filed: Dec. 16, 2004

(65) Prior Publication Data

US 2005/0152121 A1    Jul. 14, 2005

(30) Foreign Application Priority Data

Dec. 19, 2003    (JP) .............................. 2003-422758

(51) Int. Cl.
  *B32B 3/26* (2006.01)
  *C08J 9/228* (2006.01)
(52) U.S. Cl. .............. 428/319.1; 428/316.6; 428/317.7; 521/56; 521/57
(58) Field of Classification Search .............. 428/317.9, 428/319.1, 316.6, 317.7; 206/545; 361/728; 521/56, 57
See application file for complete search history.

(56) References Cited

U.S. PATENT DOCUMENTS

| | | | | |
|---|---|---|---|---|
| 4,158,031 A | * | 6/1979 | Reuter et al. ................... | 521/57 |
| 4,496,627 A | * | 1/1985 | Azuma et al. ................ | 428/336 |
| 5,010,943 A | * | 4/1991 | Boyer ......................... | 160/351 |
| 5,373,026 A | * | 12/1994 | Bartz et al. .................... | 521/82 |
| 5,885,692 A | * | 3/1999 | Imashiro et al. ............. | 428/159 |
| 6,007,905 A | * | 12/1999 | Kudo et al. .............. | 428/313.5 |
| 2004/0020823 A1 * | | 2/2004 | Yoshizawa | |
| 2004/0195142 A1 * | | 10/2004 | Hayashi et al. | |
| 2005/0113473 A1 * | | 5/2005 | Wada | |

FOREIGN PATENT DOCUMENTS

| | | |
|---|---|---|
| JP | 10-287382 A | 10/1998 |
| JP | 11-0493267 | 2/1999 |
| JP | 2001-142042 | 5/2001 |
| JP | 2002-003634 | 1/2002 |
| JP | 2003-211565 | 7/2003 |
| JP | 2003-251769 A | 9/2003 |
| JP | 2003327740 A * | 11/2003 |
| WO | WO-02/36667 A1 | 5/2002 |

OTHER PUBLICATIONS

Translation of JP 11-059893, Kishi Akihiro, "Holder, Conveyer and Delivery Stage," Mar. 2, 1999.*
Translation of JP 10-287382, Yoshida Toshio, "Tray Cassette for Base Plate," Oct. 27, 1998.*
English Abstract of JP 02-075636, Kuwabara et al, "Electrically Conductive Foamed Polyethylene Particle and Preparation Thereof," Mar. 15, 1990.*
JP 05-133678, Hasegawa et al, "Heat Insulating Box", May 28, 1993.*
Translation of JP-2000-013084, Masato Tadokoro, "Manufacture of Electromagnetic Wave Absorber", Jan. 14, 2000.*

* cited by examiner

*Primary Examiner*—Hai Vo
(74) *Attorney, Agent, or Firm*—Birch, Stewart, Kolasch & Birch, LLP

(57) ABSTRACT

A substrate, for example, a display glass substrate, can be transported and stored with high efficiency, without breaking and adhering dust. A substrate accommodating tray includes a frame member 12 formed to have a larger rectangular frame shape than a glass substrate and four support members 11, having elasticity, formed in an inside region surrounded by the frame member 12. The frame member 12 is formed with a pair of longitudinal direction frames 12*a* and a pair of width direction frames 12*b*, and the four support members 11 are arranged while being engaged with the frame member 12. Each support member 11 includes conductive polyethylene foam, which is molded by coating conductive particles on synthetic resin beads as a raw material and foaming it in this state. Therefore, transferring of the resin onto the glass substrate can be prevented during transportation and storage.

5 Claims, 2 Drawing Sheets

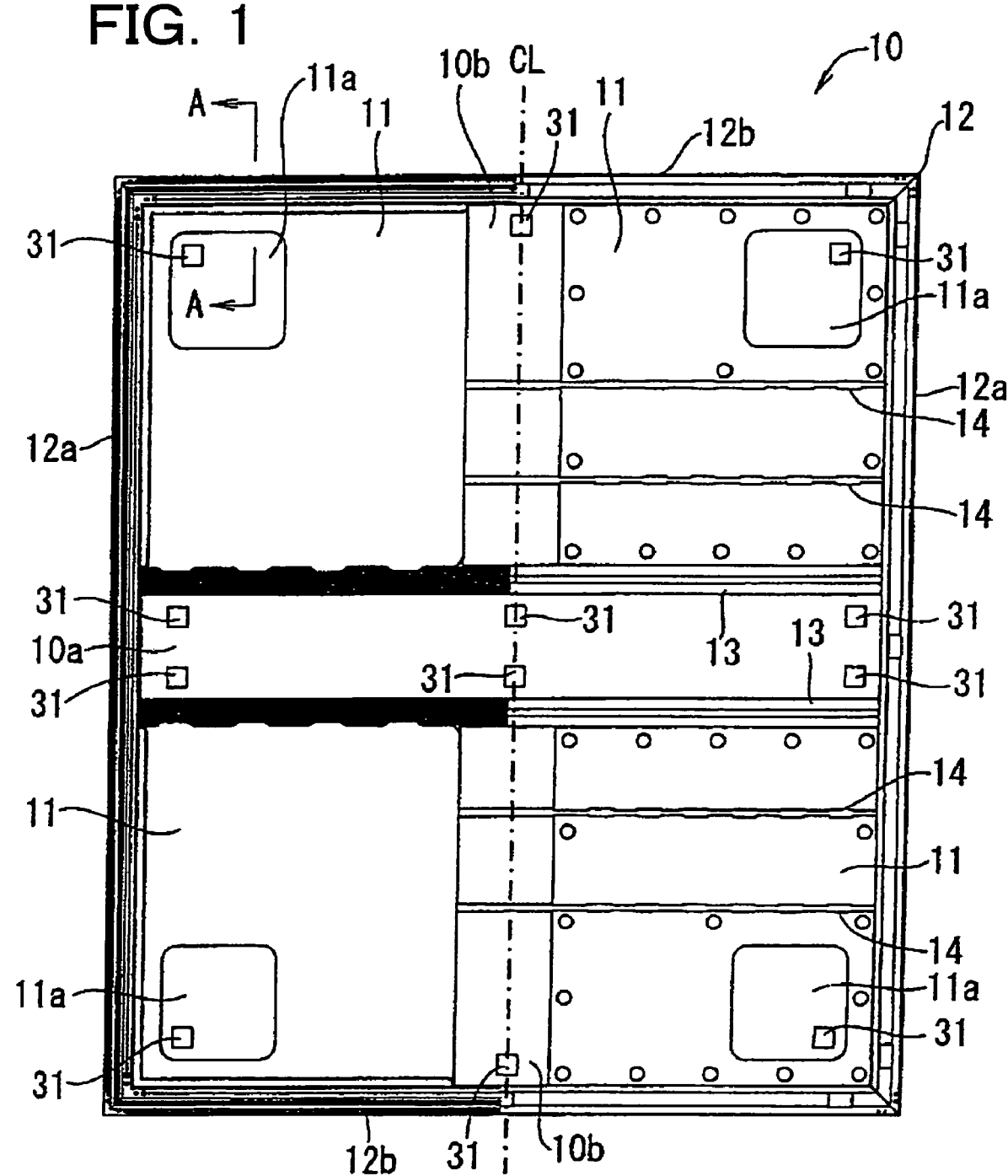

SUBSTRATE ACCOMMODATING TRAY

This Nonprovisional application claims priority under 35 U.S.C. §119(a) on Patent Application No. 2003-422758 filed in Japan on Dec. 19, 2003, the entire contents of which are hereby incorporated by reference.

BACKGROUND OF THE INVENTION

1. Field of the Invention

The present invention relates to a substrate accommodating tray used for transporting square or rectangular substrates, such as a glass substrate for a display or the like. The glass substrate is used for producing a display panel of, for example, a liquid crystal display device.

2. Description of the Related Art

A display panel for a liquid crystal display device usually includes a pair of display glass substrates opposed to each other and sealed together, and a liquid crystal material sealed between the pair of glass substrates. In order to produce such a display panel, glass substrates are transported to a display panel production plant. For transporting the glass substrates, a glass substrate accommodating box for accommodating a plurality of glass substrates is usually used. Glass substrates are used in display panels of various types of display devices as well as liquid crystal display devices. The above-mentioned type of glass substrate accommodating box is also used for transporting glass substrates used for various types of display devices other than liquid crystal display devices.

For producing display panels, the same type of glass substrate accommodating box is used for transporting display panels as half-finished products having electrodes on the glass substrate.

Recently, glass substrates having a thickness of 0.7 mm or less are widely used for various types of display panels. As the glass substrates are increasing in size, the planar area of the glass substrates which are carried to the display panel production plants is increasing, and rectangular glass substrates having a side length of 1.3 m or more are used.

Such a large and thin glass substrate easily warps. When a plurality of such glass substrates are vertically accommodated in the box with an interval, the glass substrates may warp and contact each other and break during transportation. In order to avoid this, it is necessary to keep an appropriate distance between the glass substrates in the box.

For example, a glass substrate having a thickness of 0.7 mm and a side length of 1.3 m or more may warp by 90 mm or more at the center thereof, when supported vertically along the periphery thereof with a support member having a width of 20 to 30 mm. Therefore, in a glass substrate accommodating box, it is necessary to keep a distance of at least 100 mm or more in the horizontal direction between the glass substrates in the box.

A glass substrate is usually removed from a glass substrate accommodating box using a glass substrate adsorption hand having a pair of flat adsorption pads. When such a glass substrate adsorption hand is used, it is necessary to insert each adsorption pad between two adjacent glass substrates and thus a sufficient space for inserting is necessary. A flat adsorption pad usually has a thickness of about 20 mm. Therefore, it is necessary for the distance between the glass substrates in the box to be the sum of a sufficient distance for preventing the glass substrates from contacting each other even when the glass substrates warp. Further, a distance of about 20 mm is also necessary for inserting the adsorption pad.

Since a plurality of glass substrates accommodated in a glass substrate accommodating box needs to have the suitable space between the substrates, the number of glass substrates which can be accommodated in a glass substrate accommodating box having a prescribed size is limited. Therefore, the space efficiency for transportation and storage, i.e., the number of glass substrates which can be accommodated per unit volume, decreases.

A glass substrate having a side length of 1.3 m or more is heavy having a weight per one substrate of about 5 kg. When the number of glass substrates accommodated in a glass substrate accommodating box is 20 or more, one operator cannot carry these glass substrates.

In order to solve these problems, Japanese Laid-Open Publication No. 10-287382 discloses a substrate tray cassette for accommodating one glass substrate. A substrate accommodating section of the substrate tray cassette has a lattice structure. The substrate tray cassette has an insertable engagement structure, in which a plurality of substrate tray cassettes can be stacked vertically. Such a substrate tray cassette allows a large and thin glass substrate to be accommodated without warping and thus without breaking during transportation. Since a higher number of substrate tray cassettes can be stacked vertically for transportation and storage, the space efficiency can be improved.

In the substrate accommodating tray in Japanese Laid-Open Publication No. 10-287382, the accommodated glass substrate is supported by support pins and each adsorption pad of a glass substrate adsorption hand is inserted in the space below this glass substrate. Such a space for the adsorption pads increases the size of the substrate accommodating tray. Further, since this substrate accommodating section is formed in a lattice shape, the strength of the tray has a limit and thus the number of substrate trays stacked vertically is limited.

In order to solve these problems, a substrate accommodating tray for mounting a glass substrate on a flat support member without warping is considered. However, when the glass substrate is mounted on the support member without warping, the support member contacts with a large area of the glass substrate, and thus the glass substrate may break during transportation depending on the characteristic of the support member.

For preventing the glass substrate from breaking, a synthetic resin foam body may be used as the support member. The synthetic resin foam body has comparatively excellent elasticity. However, even when the support member is made with the synthetic resin foam body, there are the following problems. That is, the surface of the glass substrate is damaged by the support member depending on the characteristic thereof. Further, a dust is generated due to the friction with the glass substrate and adheres to the glass substrate.

For preventing the dust from adhering to the glass substrate, it is considered that an antistatic function is added to the support member. For example, Japanese Laid-Open Publication No. 2003-251769 discloses a foam laminated sheet of an antistatic polypropylene resin. This foam laminated sheet of an antistatic polypropylene resin is used as a package for a heavy object, for example, a large-sized liquid crystal panel.

In this foam sheet, an unfoamed polypropylene resin layer incorporated with an antistatic agent is formed at least on one side of a foam polypropylene resin layer, and this foam sheet is suitably used as a packaging material of a liquid crystal panel. However, such a foam laminated sheet of an antistatic polypropylene resin has insufficient elasticity and high rigidity, i.e., high hardness, and thus damages the glass substrate or generates dust due to the friction with the glass substrate. In the unfoamed polypropylene resin layer incorporated with an antistatic agent, the antistatic agent is easily released due to the friction with the glass substrate, and thus a charging function is not stabilized for a long period of time. Furthermore, since the unfoamed polypropylene resin layer has a laminated structure of a foam layer and an unfoamed layer, it cannot be easily produced.

A molded object is produced by mixing an antistatic agent such as carbon or the like to a synthetic resin beads as a raw material and foaming it. This molded object is broken by an impact when supporting a heavy object such as a glass substrate, since brittleness on the foam board surface increases, i.e., the surface becomes weak. (Referring to a paragraph of [0006] in Japanese Laid-Open Publication No.2003-251769)

Furthermore, when an antistatic agent having conductivity is mixed with a resin being an organic substance in order to give antistatic properties to the foam sheet, the resin on a foam sheet surface contacts with the surface of the glass substrate and is transferred on it. Under the condition where temperature and humidity are fixed, for example, in a clean room, the resin is hardly transferred on the glass substrate and is not at a visible level. Therefore, it is not a big problem in the liquid crystal panel having electrodes on the glass substrate, or the like. However, under the condition where the temperature is about 70° C. and humidity is about 80%, for example, during the transportation by a fruck in summer, if the resin is transferred onto the glass substrate before use for a liquid crystal panel, the processing yield for a fine process to make the liquid crystal panel decreases.

The present invention solves these problems and has an object to provide a substrate accommodating tray for effectively transporting and storing a substrate, such as a display glass substrate or the like. This substrate accommodating tray can effectively transport and store the substrate without dust adhering to the substrate and without breaking the substrate by providing an antistatic friction. This substrate accommodating tray has not a problem generated to have the antistatic friction, that is, the resin of the tray is transferred on the substrate.

SUMMARY OF THE INVENTION

According to one aspect of the invention, a substrate accommodating tray having a flat support member for mounting a substrate is provided. The support member has a surface resistance of less than $10^{14}\Omega/\square$, and comprises a resin foam body capable of preventing the resin from being transferred onto the substrate.

In one embodiment of the invention, the support member is a molded object produced by coating conductive particles on polyethylene resin beads and foaming it in the coated state.

In one embodiment of the invention, the conductive particles are carbon particles.

In one embodiment of the invention, the support member has the surface resistance of $10^{14}$ to $10^{8}\Omega/\square$.

In one embodiment of the invention, the support member is arranged on an inside region surrounded by a frame member.

In one embodiment of the invention, a plurality of support members are arranged on the inside of the frame member so as not to warp the mounted substrate.

The substrate accommodating tray of the present invention includes the conductive support member made with a conductive resin foam body where the resin is not transferred onto the substrate. Therefore, this tray can prevent the resin from being transferred onto the substrate when the substrate is transported and stored under high temperature and humidity condition. In addition, since the accommodated substrate does not break and adhere dust, this tray can prevent the processing yield from decreasing when the substrate is processed to a panel or the like.

Furthermore, since an antistatic function can be stabilized for a long time, this tray can be stably used for a long time.

BRIEF DESCRIPTION OF THE DRAWINGS

FIG. 1 is a plane and bottom view of an exemplary embodiment of a substrate accommodating tray used for the present invention.

DESCRIPTION OF THE PREFERRED EMBODIMENTS

Hereinafter, the present invention will be described by way of illustrative examples with reference to the accompanying drawings.

Figure 2A:
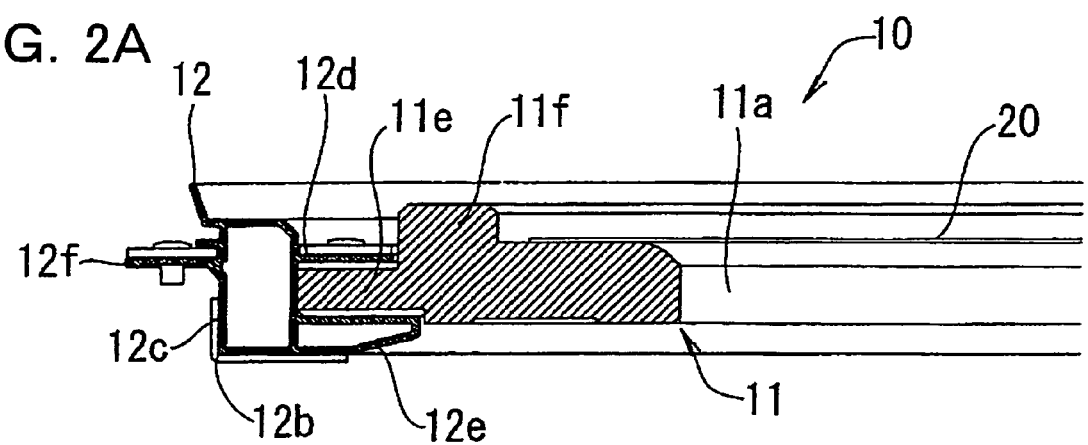
FIG. 2(a) is a partial cross-sectional view of the substrate accommodating tray taken along line A-A in FIG. 1.

FIG. 1 is a plane and bottom view of an exemplary embodiment of a substrate accommodating tray used for the present invention. FIG. 2(a) is a partial cross-sectional view of the substrate accommodating tray taken along line A-A in FIG. 1. In FIG. 1, the left side of the dashed line CL at the center of the figure is a plane view and the right side is a bottom view.

A substrate accommodating tray 10 is used for accommodating and transporting a rectangular glass substrate for a display which is used a liquid crystal display panel; specifically, a rectangular or square glass substrate having a side length of 1.3 m or more and a thickness of 0.7 mm or less.

The substrate accommodating tray 10 includes a frame member 12 having a rectangular shape, and four flat support members 11, which are arranged side by side in parallel to the horizontal direction in the inside region surrounded by the frame member 12. One glass substrate 20 (FIG. 2(a)) is horizontally mounted on these four support members 11.

The frame member 12 has a rectangular shape, and includes a pair of longitudinal direction frames 12a, and a pair of width direction frames 12b. The frames 12a have a length of about 2000 mm along the longitudinal direction, and the frames 12b have the length of about 1700 mm along the width direction perpendicular to the longitudinal direction. The longitudinal direction frames 12a and the width direction frames 12b, which are adjacent each other, are connected with a connection member and a rivet.

Each support member 11 has a same constitution. Each support member 11 has a square and flat shape made by a conductive foam polyethylene resin and has a thickness of about 15 mm and a side length of about 800 mm. This foam polyethylene resin has elasticity and conductivity in which the surface resistance is less than $10^{14}\Omega/\square$. Each support member 11 is molded by coating carbon particles on foam polyethylene beads as a raw material, foaming in a metal mold in the coated state and molding it to have a prescribed shape. In this process, carbon particles are used as a conductive material. For example, the support member 11 is molded by a product name "MEF-CB" made by Asahi Kasei Corporation.

Carbon particles coated on each of the beads are melted and bonded to each other by foaming the beads, and therefore bonded carbon certainly exist inside of the support member 11. Therefore, the support member 11 can be considered as a conductor and thus can prevent charging. The electric resistance per unit area on the surface of the conductive foam polyethylene resin (a product name "MEF-CB" made by Asahi Kasei Corporation) is $10^7$ to $10^8 \Omega$, and this conductive foam polyethylene resin is used for each support member 11. When the molded object is produced by mixing the polyethylene resin with carbon particles and foaming it in the mixed state, the electric resistance per unit area of the surface of this molded object is $10^{11}$ to $10^{12} \Omega$. Therefore, the conductivity of the conductive foam polyethylene resin is clearly improved.

Since carbon particles are melted and bonded, brittleness of the conductive foam polyethylene resin decreases, i.e., the support member 11 is strong, the support member 11 does not break by vibration or the like, and carbon does not come off due to the friction, rather than in the case of foaming in the state of mixing carbon particles with beads.

Each four support members 11 is arranged at the inside of the frame member 12 so as to engage with each corner section of the frame member 12. On the frame member 12, a pair of support members 11 is mounted along the width direction frames 12b so as to form a first space 10a. The first space 10a has a fixed width at a central area between the pair of the longitudinal direction frames 12a. Therefore, the pair of the support members 11 in the frame member 12 is divided into two by the first space 10a.

One support member 13 is engaged with the peripheral parts of the pair of the support members 11 along the first space 10a. These support members 11 are mounted along the width direction frame 12b.

For the pair of the support members 11 mounted along the width direction frame 12b, a second space (a second opening) 10b is formed between the center of the width direction frame 12b and the center of the support member 13. This second space 10b has a fixed width being smaller than the first space 10a. Therefore, each support member 11 along the same width direction frame 12b is also divided into two by the second space 10b.

In the support members 11, square openings 11a are provided in the vicinity of the corners of the frame member 12. Each side of the provided square openings 11a is parallel to any one of the longitudinal direction frame 12a or the width direction frame 12b of the frame member 12. The openings 11a have smaller areas than ¼ of the surface areas of each of the support members 11.

For the pair of the support members 11 arranged along the width direction frames 12b of the flame member 12, one support member 13 having a liner beam shape is mounted by engaging the support members 11 along the entire side in the longitudinal direction, and this side is along the first space 10a. This support member 13 is formed with aluminum, and is constructed between the pair of the longitudinal direction frames 12a in the frame member 12.

A pair of reinforcement members 14 is inserted in parallel to each support member 13 in each support member 11 engaged with the support members 13. The reinforcement members 14 are arranged between the pair of the longitudinal direction frames 12a in the frame member 12. The reinforcement members 14 are formed with an aluminum pipe for reinforcing the strength of the support members 11.

Each reinforcing member 14 is arranged between the pair of the longitudinal direction frames 12a. Therefore, each reinforcing member 14 is exposed at the second space 10b.

Each reinforcing member 14 is respectively mounted in a through hole provided in the support members 11. Each through hole is opened at a back surface side of each support member 11. The reinforcing members 14 and 15 are inserted into respectively corresponding through holes from the opening of the through hole by using the elastic force of each support member 11, and are thus mounted. The reinforcing members 14 are not exposed on the surfaces of the support members 11 on which a glass substrate 20 is mounted.

FIG. 2(a) is a partial cross-sectional view taken along line A-A in FIG. 1. Frame engaging sections 11e are provided on each periphery part of the support member 11 along the longitudinal direction frame 12a and the width direction frame 12b of the frame member 12. The frame engaging sections 11e are engaged with the frame 12a and the frame 12b. Each frame engaging section 11e has a fixed thickness whose upper surface and lower surface are horizontal. In each support member 11, upper projection sections 11f are provided respectively, and these upper projection sections 11f project continuously from each frame engaging section 11e upwardly. An inside section from the upper projection section 11f, where opposing to the frame engaging section 11e, has a horizontal flat surface, and this flat surface is slightly higher than the upper surface of the frame engaging section 11e and slightly lower than the upper surface of the upper projection section 11f. The glass substrate 20 is mounted on this flat surface.

The longitudinal direction frame 12a and the width direction frame 12b of the flame member 12 have the same cross-sectional shapes as each other, and are made, for example, with molded aluminum. On each frame 12a and 12b, a frame body section 12c is provided along the entire periphery so as to contact with each side of the frame engaging section 11e in the support member 11. This frame body section 12c has a cross-sectional, hollow, rectangular parallelpiped shape. The frame body section 12c projects upwardly and downwardly from the upper and lower surfaces of the frame engaging section 11e. An end part projecting upwardly from the frame body section 12c is placed upper than the upper surface of the upper projection part 11f, and the lower surface of the frame body section 12c is placed lower than the back surface of the support member 11.

On the frame body section 12c, an upper engaging section 12d is provided along the entire periphery. This upper engaging section 12d has a horizontal belt plate shape and contacts with the upper surface of the frame engaging section 11e in the support member 11. In the frame body section 12c, a lower engaging section 12e is provided. This lower engaging section 12e contacts with the lower surface of the frame engaging section 11e. This lower engaging section 12e is attached at a lower side of the frame body section 12c, and has a flat, hollow, rectangular parallelepiped shape in cross-section, and has a taper shaped lower surface at the inside.

On the frame body section 12c, a flange section 12f is provided along the entire periphery at approximately the same height as the upper engaging section 12d. This flange section 12f projects outwardly and opposing to the upper engaging section 12d. This flange section 12f is used for chucking the substrate accommodating tray 10 by a chucking device or the like when conveying this tray 10 in a horizontal state.

Figure 2B:
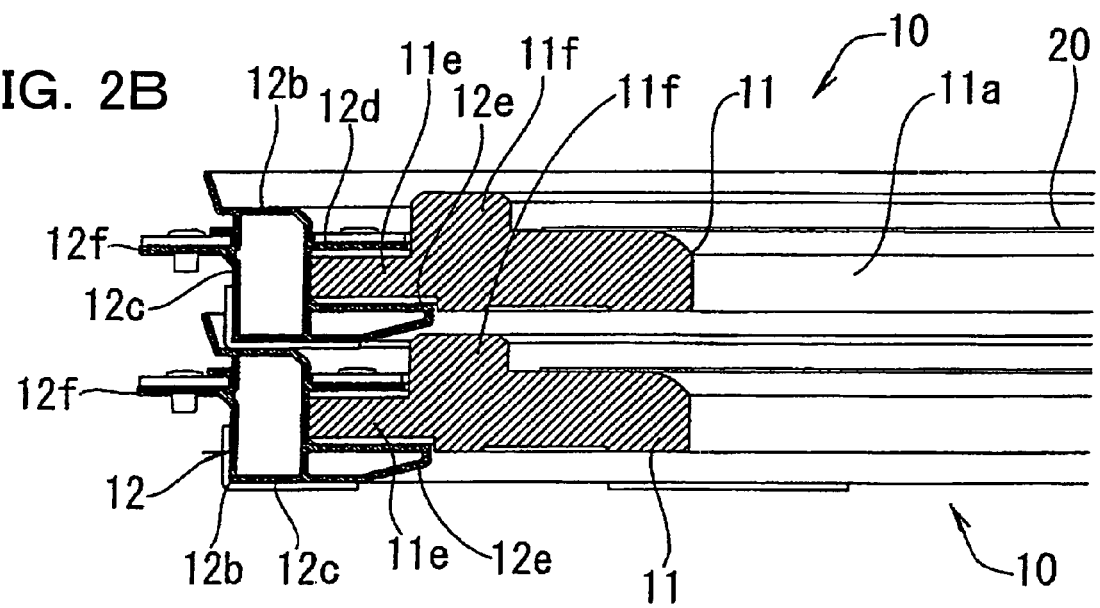
FIG. 2(b) is a partial cross-sectional view corresponding to FIG. 2(a) in the state that two substrate accommodating trays are stacked vertically.

The substrate accommodating tray 10 can be stacked vertically. As shown in FIG. 2(b), when each substrate accommodating tray 10 is stacked vertically, a top surface of the frame body section 12c in the frame member 12, is engaged with a bottom surface of the frame body section 12c of a second accommodating tray 10, which is placed above the first accommodating tray 10 so as to be supported. The top surface of the frame body 12c can be positioned and engaged with the bottom surface of the frame body section 12c.

As shown in FIG. 2(b), a plurality of substrate accommodating trays 10, where glass substrates 20 are accommodated, can be stacked vertically and transported. In this case, the substrate accommodating trays 10 on top are engaged with the substrate accommodating trays 10 on the bottom by positioning and engaging a top surface of the frame body section 12c of the bottom of accommodating tray 10 with a bottom edge of the frame body section 12c of the top accommodating tray. Therefore, the substrate accommodating trays 10 stacked vertically do not slip in a horizontal direction with respect to each other.

Since a surface of the glass substrate 20 accommodated on each support member 11 is placed lower than an top surface of the frame member 12, the surface of the glass substrate 20 does not contact with the substrate accommodating tray 10 stacked on top.

In the substrate accommodating tray 10 having the above-described structure, the glass substrate 20 for a liquid crystal panel having, for example, a thickness of 0.7 mm, or less, and a side length of 1300 mm, or more, is accommodated on the top surface of the bottom section 11. A surface of the glass substrate 20 which does not have electrodes or the like is in contact with the top surface of the bottom section 11. The glass substrate 20 is supported by each support member 11 in a horizontal state without warping.

The glass substrate 20 is mounted on four support members 11 comprising a conductive foam polyethylene resin having elasticity. The support members 11 have better elasticity and abrasion resistance than a polypropylene foam or the like. Therefore, the glass substrate 20 can be prevented from breaking by an impact, or the like, applied against the substrate accommodating trays 10 during transportation. In addition, the generation of dust due to the friction with the glass substrate can be controlled. Since each support member 11 is conductive, the substrate 20 can be prevented from being charged and therefore no dust will adhered on the glass substrate 20.

Since each support member 11 is moldedby coating carbon on beads of a polyethylene resin as a conductive material and foaming it in the coated state, the polyethylene resin included in each support members 11 is not transferred on the glass substrate 20 even under high temperature and humidity conditions. Therefore, the decreasing of the processing yield can be prevented when the glass substrate 20 is processed to form a liquid crystal display panel.

In the substrate accommodating tray 10 according to the present invention, when the accommodated glass substrate 20 is removed, removing pins 31 are inserted into first and second spaces 10a and 10b, provided between adjacent support members 11, and first openings 11a provided in each support member 11. (Referring in FIG. 1.) For example, four removing pins 31 are inserted into corners close to the corners of each frame member 12 in the openings 11a provided in each support member 11. Two removing pins 31 are inserted into positions close to each width direction frame 12b in each second space 10b formed at the center in the width direction of the frame 12. Three removing pins 31 are inserted along each support member 13 in the first space 10a formed at the center in the longitudinal direction of the frame member 12. Then, a total of 12 removing pins 31 upwardly raise the glass substrate 20 accommodated in the substrate accommodating tray 10, and thereby the glass substrate 20 is removed from the substrate accommodating tray 10.

In the above example, one glass substrate 20 is supported by four support members 11. The present invention is not limited to such a structure, and if the mounted substrate does not warp at least, a substrate, for example, the glass substrate 20 or the like may be supported by a plurality of support members or one support member.

In the above example, the substrate accommodating tray 10 is for accommodating a glass substrate 20 for a liquid crystal display panel. The substrate accommodating tray handled by a substrate transfer apparatus according to the present invention is not limited to such a substrate, and may be a glass substrate for other types of display panels. The substrate handled by the substrate transfer apparatus according to the present invention is not limited to a glass substrate and may be a synthetic resin substrate or the like.

As described above, the present invention is explained using the preferable example according to the present invention. The present invention is not limited to this example. The applicable range of the present invention must be interpreted only by claims. The contractor can perform the equivalent range based on the description and technical common sense according to the present invention, from the description of the preferable concrete example according to the present invention. The patent, application for patent, and document which were quoted in this specification are used as reference with respect to this specification as same as the contents of these are concretely described in this specification.

As described above, in a substrate accommodating tray, the substrate such as a display glass substrate or the like can be transported and stored with high efficiency, without breaking and without adhering a dust, and the decreasing of the processing yield can be prevented. The substrate accommodating tray is, for example, used for transporting square or rectangular substrates, such as a display glass substrate or the like, and the glass substrate is used for producing a display panel of, for example, a liquid crystal display device.

What is claimed is:

1. A substrate accommodating tray, comprising:
   a flat support member for mounting a substrate,
   wherein the support member has a surface resistance of greater than $10^7\Omega/\square$ and less than $10^{14}\Omega/\square$, and comprises a resin foam capable of preventing a resin from being transferred and adhered to the substrate, and
   wherein the support member is a molded object produced by coating electrically conductive particles on beads comprising polyethylene resin and the conductive particles bonded together by foaming the coated beads in forming the resin foam, and
   wherein all the beads are substantially covered with the conductive coatings such that the conductive coatings of adjacent beads are bonded together.

2. The substrate accommodating tray according to claim 1, wherein the conductive particles are carbon particles.

3. The substrate accommodating tray according to claim 1, wherein the support member has a surface resistance of greater than $10^7\Omega/\square$ and up to $10^8\Omega/\square$.

4. The substrate accommodating tray according to claim 1, wherein the support member is arranged on an inside region surrounded by a frame member.

5. The substrate accommodating tray according to claim 4, wherein a plurality of support members are arranged on the inside of the frame member so as not to warp the mounted substrate.

* * * * *